United States Patent [19]

Duzy et al.

[11] Patent Number: 4,783,749

[45] Date of Patent: Nov. 8, 1988

[54] BASIC CELL REALIZED IN THE CMOS TECHNIQUE AND A METHOD FOR THE AUTOMATIC GENERATION OF SUCH A BASIC CELL

[75] Inventors: Peter Duzy; Ralf De Marino, both of Munich; Berghardt Schallenberger, Feldolling, all of Fed. Rep. of Germany

[73] Assignee: Siemens Aktiengesellschaft, Berlin and Munich

[21] Appl. No.: 852,159

[22] Filed: Apr. 15, 1986

[30] Foreign Application Priority Data

May 21, 1985 [DE] Fed. Rep. of Germany ....... 3518264

[51] Int. Cl.⁴ .............................. H01L 27/02
[52] U.S. Cl. ................... 364/491; 364/490; 364/489; 357/42
[58] Field of Search .............. 364/488, 489, 490, 491; 357/40, 44, 45, 42, 41; 307/303

[56] References Cited

U.S. PATENT DOCUMENTS

| | | | |
|---|---|---|---|
| 4,562,453 | 12/1985 | Noguchi et al. | 357/41 |
| 4,589,007 | 5/1986 | Kuboki et al. | 357/42 |
| 4,613,940 | 9/1986 | Shenton et al. | 364/488 |
| 4,651,190 | 3/1987 | Suzuki et al. | 357/41 |
| 4,663,646 | 5/1987 | Ikawa et al. | 357/41 |

*Primary Examiner*—Parshotam S. Lall
*Assistant Examiner*—V. N. Trans
*Attorney, Agent, or Firm*—Hill, Van Santen, Steadman & Simpson

[57] ABSTRACT

A basic cell constructed in accordance with the CMOS technique for building electronic circuits is provided, wherein a plurality of transistors, maximally four transistors, are arranged next to one another. First interconnects essentially composed of polysilicon are arranged parallel to the extent of the first transistors and second interconnects essentially composed of metal are arranged perpendicular to the first interconnects. The second interconnects extend either over the transistors or between the transistors. Transistors respectively arranged in one of two groups are combined to form a parallel or series circuit. Metal tracks are arranged in the basic cell outside of the transistor surfaces at the lateral cell edge. Polysilicon interconnects and/or metal interconnects are established perpendicular to the appertaining directions, namely parallel to the extent of the transistors or, respectively, perpendicular thereto. The interconnects are arranged such that a respective following interconnect has its course adapted to the contour of the previously defined interconnects. Further, required contacts at the interconnects are arranged shifted with respect to the interconnects connected thereto such that they are dislocated into a bay contained at the appertaining, neighboring interconnect.

6 Claims, 4 Drawing Sheets

Basic Cell Generator

Basic Cell

Layering Mechanism

With Basic Cell Generated
Function Block Generated With Basic Cells

Basic Cell Generator

Before Optimization

Diffusion — Metal — Poly-Si

After Optimization

Topological Optimization

BASIC CELL REALIZED IN THE CMOS TECHNIQUE AND A METHOD FOR THE AUTOMATIC GENERATION OF SUCH A BASIC CELL

BACKGROUND OF THE INVENTION

1. Field of the Invention

The present invention relates to a basic cell realized in the (complementary-metal-oxide-semiconductor) (CMOS) technique for building up electrical circuits, whereby a plurality of transistors are arranged next to one another, whereby first interconnects essentially composed of polysilicon are arranged parallel to the extent of the transistors, second interconnects essentially composed of metal are arranged perpendicular to the first interconnects, and the second interconnects extend either above the transistors or between the transistors, and to a method for the automatic generation of such a basic cell in accordance with the German patent application No. P 34 22 715.6, fully incorporated herein by this reference.

2. Description of the Prior Art

The increasing complexity of very large scale integrated (VLSI) electrical circuits requires an increasingly more difficult manual design of the circuit layout. The great number of discrete geometrical structures forces a switch to automatic layout generation. In such a layout generation method, the geometrical layout structures are acquired from an abstract circuit description with the assistance of software. The individual layout rectangles are thereby dimensioned and placed by means of a program. The particular advantages of a layout generation via software are high flexibility, fast adaptation to new design rules and short design times.

The overall layout of anelectrical circuit is formed from a plurality of such layout rectangles. In the personal design of the electronic circuit, each rectangle is individually dimensioned and individually located. Given such a method, however, the complexity is not reduced, so that the layout of larger circuits can only be generated with a high expense. The gate-matrix method, by contrast, reduces the complexity of the circuit design since only defined grid points of a matrix are permitted for the placement of the geometrical structures. In accordance with the gate-matrix principle, layouts are generated in the scope of standard cells and are subsequently further processed with traditional methods. Another method for automatic layout generation of even involved VLSI circuits reduces the complexity of the circuit design with the assistance of the basic cell concept. A layout is thereby constructed of highly-paramaterized basic cells. The relative arrangement of individual geometrical structures relative to one another is roughly prescribed within a basic cell. Further methods for the production of the electronic circuits can be derived, for example, from the brochure CAD für VLSI by H. G. Schwärtzel, Springer-Verlag, 1982, for example on Pages 63–76, fully incorporated herein by this reference.

SUMMARY OF THE INVENTION

In improvement of the structure disclosed in the German patent application No. P 34 22 715.6, the object of the present invention is to provide a basic cell, realized in CMOS technique, which comprises a high wiring flexibility, which can contain a maximum of four transistors which are configurable for obtaining arbitrarily required digital circuits, and whose layout allows a more improved circuit exploitation. The object of the present invention, therefore, is also in the creation of a method for the automatic generation of such a basic cell.

The object of the invention in creating a desired basic cell is achieved by way of a basic cell realized in CMOS technique, whereby a plurality of transistors are arranged next to one another, whereby first interconnects essentially composed of polysilicon are arranged parallel to the extent of the transistors, whereby second interconnects essentially composed of metal are arranged perpendicular to the first interconnects, and whereby the second interconnects extend either above the transistors or between the transistors, all in accordance with the German patent application No. P 34 22 715.6. The invention is particularly characterized in that, a maximum of four transistors are provided per basic cell, whereby respectively one group of transistors is executed in n-channel technology and another group of transistors is executed in p-channel technology, the groups being respectively assigned to a first or, respectively, to a second region of the basic cell. The transistors respectively arranged in one of the groups are combined to form a parallel or series circuit. Metal tracks are arranged in the basic cell outside of the transistor areas at the lateral cell edge. Polysilicon interconnects and/or metal interconnects are established perpendicular to the appertaining privileged directions, namely parallel to the extent of said transistors or, respectively, perpendicular thereto. The interconnects are arranged such that a respectively following interconnect has its course adapted to the contour of the previously defined interconnects in order to achieve a good surface exploitation by way of such a "snuggling" interconnect management. The required contacts at the interconnects are arranged shifted such with respect to the interconnects connected thereto that they are dislocated into a bay contained in the appertaining, neighboring interconnect in order to further improve the surface exploitation.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
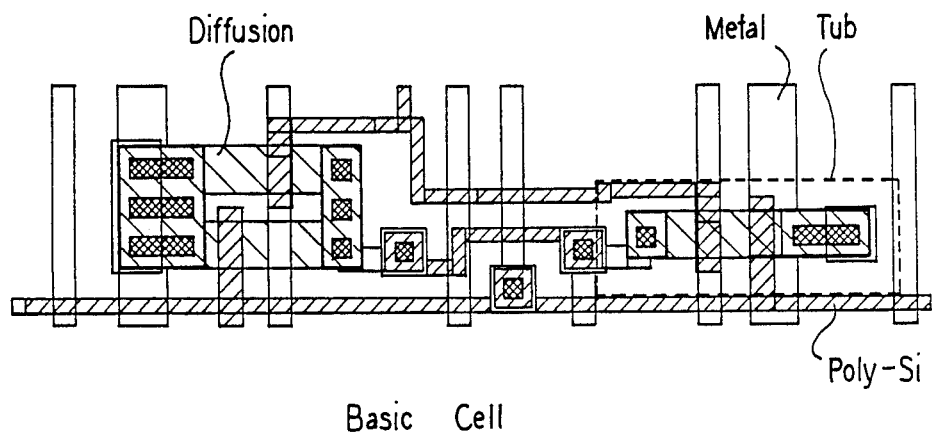
FIG. 1 is a plan view of the layout of an exemplary embodiment of a basic cell constructed in accordance with the present invention.

Basic cells for the construction of a circuit module comprise only a few transistors. FIG. 1 illustrates a layout of an exemplary embodiment of a basic cell which is structured in accordance with the present invention. By way of example, this basic cell illustrated in FIG. 1 is constructed as an NAND gate having two inputs.

The layout of FIG. 1 is composed of two transistor regions which are separated by a wiring channel. This arrangement is aimed at the design of bit slice cells of a data path in CMOS technique. For example, the p-channel transistors lie to the left of the wiring channel and the n-channel transistors lie to the right of the wiring channel, or vice versa. Each transistor region can be composed of a single transistor or of a parallel or series connection of two transistors. All gates are vertically located. The vertically-extending metal tracks are provided for the data flow and for the power supply. The control lines in polysilicon extend horizontally. In order, however, to achieve a good surface exploitation, vertical polysilicon lines are also established. All transistor connections can be conducted to one of the four cell edges at an arbitrary location both in metal and in polysilicon. The terminal widths, as well as the internal interconnect widths, are individually prescribable Racers (lines without cell-internal connection) can be inserted at arbitrary locations. An edge bus which optimizes the coordinate matching of horizontal lines to other circuits is respectively provided at the left-hand cell edge and at the right-hand cell edge.

Despite this design strategy that has been provided, the basic cell is not circuit-specific. The basic cell is individualized by occupying a series of parameters which are to be transmitted to a generator program, i.e. contacts are placed, wiring tracks are laid and transistors are dimensioned in accordance with the circuit to be realized. So-called expert functions optimize the internal cell layout structure.

According to the invention, a maximum of four transistors are provided per basic cell, whereby a respective group of transistors is constructed in n-channel technology and another group of transistors is constructed in p-channel technology, these groups being respectively assigned to a first or, respectively, second region of the basic cell. The transistors respectively arranged in one of the groups are combined to form a parallel or series circuit. Metal tracks are arranged in the basic cell outside of the transistor areas at the lateral cell edge. Polysilicon interconnects and/or metal interconnects are fashioned perpendicular to the appertaining track directions, namely parallel to the extent of the transistors or, respectively, perpendicular thereto. The interconnects are arranged such that a respectively following interconnect has its own course adapted to the contour of the previously-defined interconnects in order to achieve a good surface exploitation by such a "snuggling" interconnect management (cf. FIG. 2). Further, required contacts to the interconnects are arranged shifted with respect to the interconnects connected thereto such that they are displaced into a bay contained in the appertaining, adjacent interconnect in order to further improve the surface exploitation.

A basic cell generator communicates with all other generator procedures via a defined interface. The flexibility of the basic cell is expressed in the content of this procedure interface. For the realization of a specific structure, this interface is to be coupled with the following data:

Design rules of the current manufacture process;
Cell individualization for specifying the internal cell interconnection in a form similar to a network list;
Cell-specific construction rules, for example horizontal or vertical attitude of the transistor gates;
Cell connections for prescribing the coordinates; and
General control data which define whether and in what manner a layout or a simulation model is to be generated.

Output via the basic cell interface as a result of the generation are:
A layout, for example in HKP format;
Simulation model; and
Realized cell dimensions and connection coordinates.

An important characteristic of the basic cell generator is its independence from the design rules of a specific manufacturing process. The required formatting algorithms take into consideration all of the spacing rules coming into question for a structure and its environment, and not only those that are critical in contemporary processes. A fault-free layout formatting (correctness by construction) is therefore guaranteed.

The following parameters see to a flexible layout design:
Number of transistors (two or four);
Transistor dimensions;
Width prescription, individually for every line;
Number and position of horizontally and vertically traversing lines ("racers") without internal cell connections;
Coordinates and wiring levels of the cell connections;
Position of the tub and, therefore, position of the p-transistors and, respectively, n-transistors; and
Cell mirroring.

As a result of the coordinate prescription of the basic cell connections, basic cell complexes and, therefore arbitrarily extensive circuits can be constructed by fit-suited joining (abutment). An activation of a wiring program for linking the basic cells can therefore be eliminated.

Consideration of lines running through the basic cell without internal cell connection is an especially important property. Such racers can be inserted without problem or removed at any time since the layout is completely generated anew with the current parameters in every generator call-in. The manipulations at existing layout data required in other known concepts are therefore eliminated.

The surface exploitation is the determining factor for the quality of the layout. For this reason, topological and geometrical optimization steps are provided in accordance with the present invention.

Automatic layout generation means that the dimensioning and arrangement of circuit elements and the definition of geometrical structures connected therewith are taken out of the hands of the designer and transferred into a program. The prerequisite is a suitable language for describing geometrical structures. The higher programming language Pascal is advantageously employed therefor instead of a specific layout description language, being augmented by geometrical primitives (embedded layout language). All possibilities of the standard language are therefore available for a required procedural description. The procedural description enables the parameterization of the layout and an independence from design rules.

Figure 4:
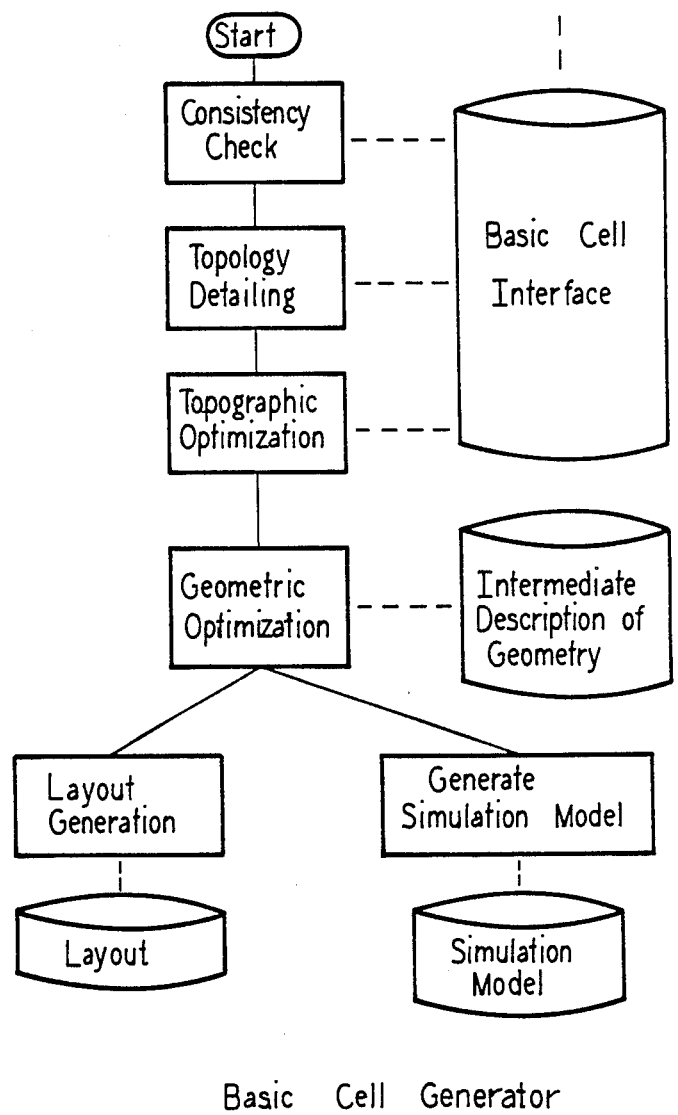
FIG. 4 is a flow chart of the structure for realizing a basic cell in accordance with the present invention, and with respect to a particular program.

In order for compactness and quality of automatically generated layouts to approach those of "hand layouts" the layout strategies were analyzed by design experts. Their procedures were crystallized and algorithmically formulated. Procedures for the automatic placement of transistors, contacts and interconnects arose therefrom. The various procedures of a basic cell generator (FIG. 4) accomplish the task set forth below.

Consistency Check

The content of the interface is checked for consistency. Among other things, the procedure identifies whether all transistor electrodes are connected and whether all lines have open ends.

Topological Detailing

The basic cell individualization prescribed via the generator interface has the form of an abstract network list. In order to generate a specific layout, this network list must be converted into a detailed circuit description. A procedure was therefore implemented which generates a complete information about all required structures such as, for example, interconnects as connecting elements between nodes of the network list.

Topological Optimization

Following the topological detailing, procedures are executed which topologically and geometrically optimize the basic cell. Every optimization routine contains specific expert functions.

A significant part of the topological optimization is comprised in finding the optimum sequence of the horizontal interconnects. Contained therein is the definition of which interconnects are arranged under or, respectively, over the transistor. To this end, decision criteria are deposited in this procedure, these being applied to this disposition problem. Such criteria are, for example:
Vertical branching from the horizontal interconnect in the same level;
Connections to the transistor gate;
Vertical branchings with change of level; and
Prescriptions of the interconnect coordinates.

Figure 5:
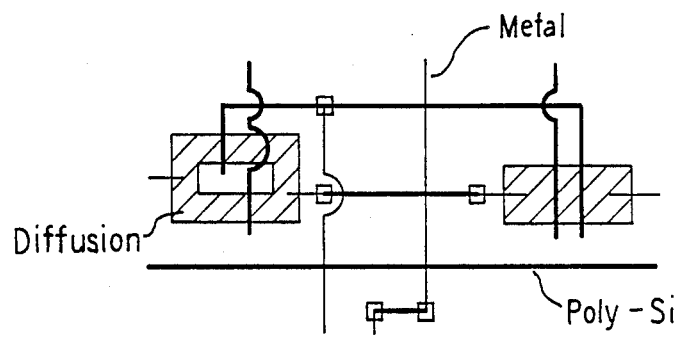
FIG. 5 is a schematic illustration of an example of topological optimization.
Figure 5:
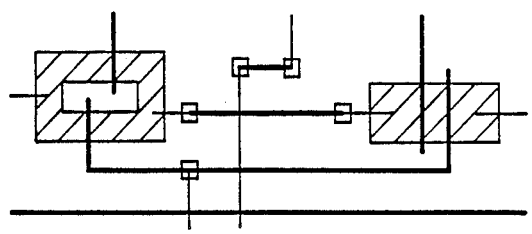

FIG. 5 illustrates a typical starting situation and the result of the optimization.

Geometry Optimization

The geometrical optimization begins after the definition of the topology. The coordinates of the vertical lines are thereby defined first. Topological information are thereby also involved, for example whether a contact is required at a vertical line. After this step, the lines follow one another as densely as possible. The layout elements (transistors, horizontal polysilicon tracks, contacts) can be "hooked" into this basic skeleton.

Figure 2:
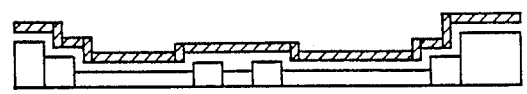
FIG. 2 schematically illustrates the principle of a layering mechanism.

In order to guarantee a compact placement of the layout elements, a flexible horizontal cell edge is introduced which reproduces the exact course of the upper boundary of located structures. This edge is differentiated according to layout levels. The edge is updated after each newly-added structure. For example, a horizontal interconnect is placed such that it "forms" to the current edge as greatly as possible. Jogs are automatically generated and at the right location. The jog procedure thereby avoids a non-sensical line laying with unnecessarily deep and narrow grooves. This principle of structure placement is referred to as "layering" (FIG. 2).

The flexible edge is likewise taken into consideration in the placement of contacts. Added thereto is an identification of the horizontal displacement play of the contact. This play is exploited in order to displace the contact into a deeper bay of the flexible edge under given conditions. Whether further contacts lie in the proximity of the contact to be placed is identified in addition. (This information can be taken from the interface content.) A placement routine then calculates the contact position such that all neighboring contacts can be arranged in the most space-saving manner. However, contacts are not always placed as deeply as possible, since the length of the interconnect to be connected also enters into consideration.

The explained sub-routines for geometrical layout generation are respectively self-contained, thus autonomous and can therefore also be utilized in other basic cell generators.

Figure 3:
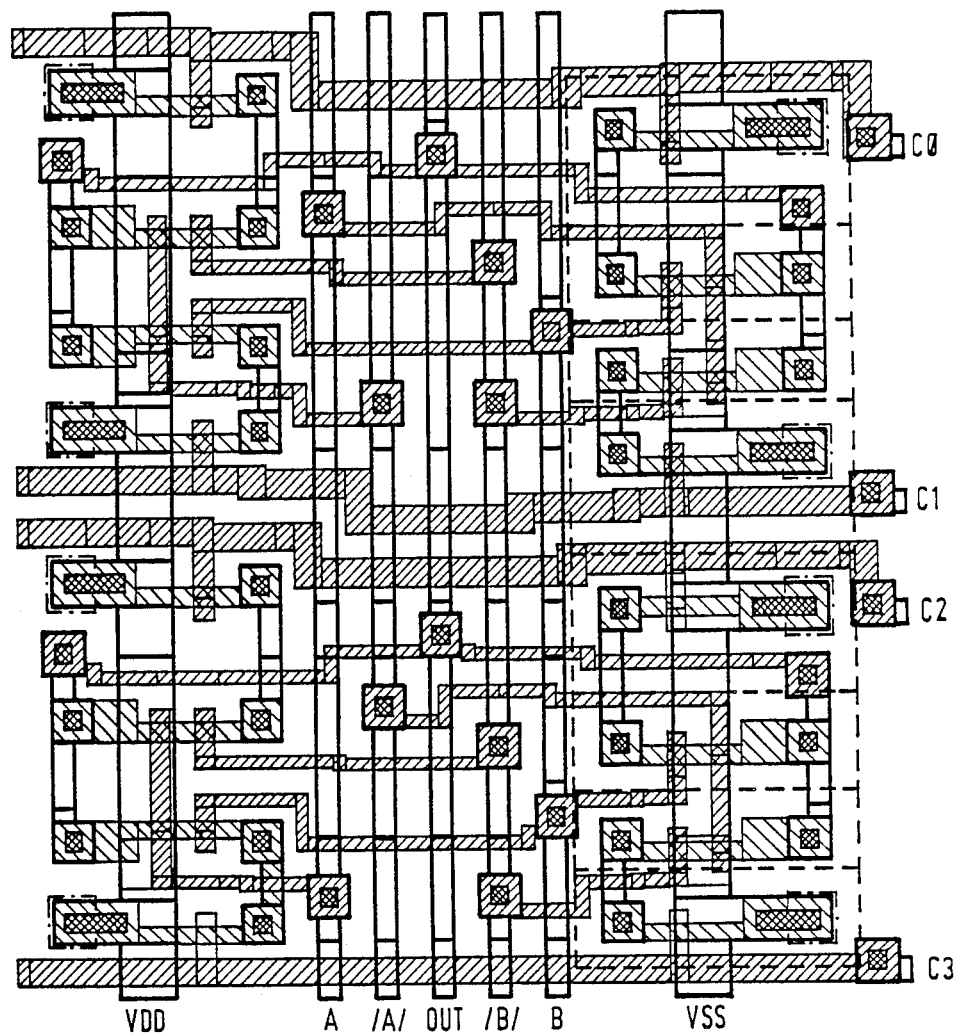
FIG. 3 is a plan view of the layout of a typical functional block which is realized with basic cells generated in accordance with the present invention.

Complete circuit modules are constructed of basic cells, such as the elements of the lowest hierarchy stage of a module. As an exemplary embodiment, FIG. 3 illustrates a subcircuit constructed of a plurality of the above-described basic cells, such as can be utilized in a bit slice cell of a data path.

The basic cell generation concept of the invention reduces the complexity connected with the design of VLSI layouts. Due to the numerous parameterization possibilities and the great flexibility, basic cells, the most elementary module building blocks, permit an automatic cell adaptation to the respective layout environment. The procedural layout description leads to the independence of the module generator from the design rules of the specific manufacturing process. Algorithms for topological and geometrical optimization assure an efficient surface exploitation. A simulator connection generated parallel to the layout generation allows a fast verification of the modules constructed of basic cells.

The described basic cell is, in fact, tailored for data paths, but not in a function-associated manner. For specific applications, however, the production of a basic cell generator optimize for the circuit function to be designed is meaningful (for example, random access memory (RAM), read out memory (ROM)). The advantages of the high layout flexibility due to procedural description also hold true for such specific basic cell generators.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a basic cell of the type constructed in accordance with complementary-metal-oxide-semiconductor technology, in which a plurality of transistors are arranged next to one another, a plurality of polysilicon first interconnects are arranged parallel to the extent of the transistors, and a plurality of metal second interconnects are arranged perpendicular to the first interconnects and extend adjacent the transistors, the improvement wherein:

a maximum of four transistors are provided per basic cell and comprising first and second groups, said transistors of said first group being n-channel transistors and the transistors of said second group being p-channel transistors, said first group located in a first region of the cell and said second group located in a second region of the cell;

the transistors of said first group being interconnected to form a first circuit and the transistors of the second group being interconnected to form a second circuit;

metal tracks are arranged in the cell outside of the transistor areas at a lateral cell edge;

interconnects are provided adjacent said transistors and arranged such that an interconnect next following a previously formed interconnect extends adapted to the contour of the previously formed interconnect; and contacts are provided and arranged shifted with respect to interconnects connected thereto such that they are located in a bay formed in the appertaining neighboring interconnect.

2. The improved basic cell of claim 1, wherein: the transistors of a group are connected in parallel.

3. The improved basic cell of claim 1, wherein: the transistors of a group are connected in series.

4. The improved basic cell of claim 1, wherein: the interconnects comprise different widths.

5. A method of generating a basic cell of the type constructed in accordance with complementary-metal-oxide semiconductor technology, in which a plurality of transistors are arranged next to one another, a plurality of polysilicon first interconnects are arranged parallel to the extent of the transistors, and a plurality of metal second interconnects are arranged perpendicular to the first interconnects and extend adjacent the transistors, a maximum of four transistors are provided per basic cell and comprising first and second groups, said transistors of said first group being n-channel transistors and the transistors of said second group being p-channel transistors, said first group located in a first region of the cell and said second group located in a second region of the cell; the transistors of said first group being interconnected to form a first circuit and the transistors of the second group being interconnected to form a second circuit; metal tracks are arranged in the cell outside of the transistor areas at a lateral cell edge; interconnects are provided adjacent said transistors and arranged such that an interconnect next following a previously formed interconnect extends adapted to the contour of the previously formed interconnect; and contacts are provided and arranged shifted with respect to interconnects connected thereto such that they are located in a bay formed in the appertaining neighboring interconnect; comprising the steps of:

describing the basic cell with a plurality of parameters;

topologically optimizing the relative positions of the connection elements within the basic cell; and geometrically optimizing the arrangements of the individual elements of the basic cell to achieve optimum surface exploitation.

6. The method of claim 5, and further defined as: programming the method in the Pascal language.

* * * * *